(12) United States Patent
Lee et al.

(10) Patent No.: US 6,839,278 B1
(45) Date of Patent: Jan. 4, 2005

(54) HIGHLY-INTEGRATED FLASH MEMORY AND MASK ROM ARRAY ARCHITECTURE

(75) Inventors: Peter Lee, Saratoga, CA (US); Fu-Chang Hsu, San Jose, CA (US)

(73) Assignee: Aplus Flash Technology, Inc., San Jose, CA (US)

(*) Notice: Subject to any disclaimer, the term of this patent is extended or adjusted under 35 U.S.C. 154(b) by 55 days.

(21) Appl. No.: 10/353,584

(22) Filed: Jan. 29, 2003

Related U.S. Application Data

(60) Provisional application No. 60/355,472, filed on Feb. 7, 2002.

(51) Int. Cl.[7] .............................................. G11C 16/04
(52) U.S. Cl. .............. 365/185.17; 365/104; 365/185.33
(58) Field of Search ........................... 365/185.17, 104, 365/185.33

(56) References Cited

U.S. PATENT DOCUMENTS

| | | | |
|---|---|---|---|
| 5,666,304 A | * 9/1997 | Hikawa et al. | 365/104 |
| 5,793,678 A | 8/1998 | Kato et al. | 365/185.27 |
| 5,844,270 A | 12/1998 | Kim et al. | 257/315 |
| 5,986,933 A | * 11/1999 | Takeuchi et al. | 365/185.17 |

* cited by examiner

*Primary Examiner*—Huan Hoang
(74) *Attorney, Agent, or Firm*—George D. Saile; Stephen B. Ackerman; Doulgas R. Sohnabel

(57) ABSTRACT

A memory device is achieved. The memory device comprises an array of Flash cells and mask ROM cells in a common substrate. Each Flash cell comprises a floating gate, a control gate, a source, a drain, and a channel. Each mask ROM cell comprises a gate, a source, a drain, and a channel. Each source of the mask ROM cells is shared with one Flash cell source. Each electrode of each mask ROM cell gate is coupled to at least one Flash cell control gate. The mask ROM cell gate electrodes comprise a common layer with electrodes of the Flash cell control gates. The mask ROM cells lie in spaces between the Flash cells in the array.

35 Claims, 16 Drawing Sheets

HIGHLY-INTEGRATED FLASH MEMORY AND MASK ROM ARRAY ARCHITECTURE

This application claims priority to U.S. Provisional Application Ser. No. 60/355,472 filed on Feb. 7, 2002, herein incorporated by reference.

BACKGROUND OF THE INVENTION (1) Field of the Invention

The invention relates to digital memory devices and, more particularly, to a highly-integrated, Flash memory and mask ROM array architecture.

(2) Description of the Prior Art

Flash memory is widely used in today's electronic products, especially for portable applications that require non-volatility and in-system re-programmability. The basic Flash memory cell structure consists of a control gate, a floating gate, source, and drain. The source and drain are two heavily doped regions on a silicon substrate. A channel exists for electrons to flow from drain to source. The floating gate is located between the control gate and channel. The floating gate electrode is isolated from the substrate by a thin tunnel oxide layer. A dielectric layer isolates the floating gate electrode from the control gate electrode.

When the control gate, drain, and source are biased to proper voltages, electrons can move through the tunneling oxide to either charge or discharge the floating gate. These bias conditions are called programming and erasing operations. By isolating the floating gate electrode, electrons on the floating gate are trapped during normal, non-program and non-erase, operating conditions. If the program or erase operations cause electron movement between the channel region and the floating gate, then this is considered a "channel operation." If the program or erase operations cause electron movement between the edge of either the source or drain regions and the floating gate, then this is considered an "edge operation."

An increase in the number of electrons on the floating gate will cause the cell threshold voltage to increase. The threshold voltage is defined as the control gate bias needed to allow current flow from drain to source. The threshold voltage depends on the amount of charge trapped in the floating gate. Therefore, the Flash cell can be programmed or erased by either injecting electrons into or removing electrons from the floating gate. Single level cell (SLC) technology requires two different threshold voltages to represent a "0" or a "1." Multiple level cell (MLC) technology uses N threshold voltages to represent $2^N$ possible values per cell.

Two different operations are used to change the Flash memory cell threshold voltage. An erase operation, that is typically applied to a large number of cells, called a block, will collectively change the threshold voltage for all the cells in the block. The program operation is performed on a smaller number of cells, called a page. During programming, the threshold voltage of each cell is changed selectively depending on the desired data. There are various mechanisms and technologies suitable for erasing and programming different types of Flash memories. In this present invention, the well-known Fowler-Nordheim (F-N) tunneling mechanism is described as an example.

A memory array comprises a plurality of memory cells arranged in columns and rows. In each row, the control gates of the cells are connected to form word lines. The source and drains of the cells in a column of cells are connected to form source and bit lines. A cell can be read, erased, and programmed in this array by applying proper bias voltages to the word lines and the bit lines connected to the source and drains.

There are several types of memory arrays found in the prior art. For example, NOR, NAND, AND, DINOR, dual string NOR, and OR type arrays are used. Typically, these memory arrays require the used of an isolation region between adjacent bit lines or sources. Conventionally, shallow trench isolation (STI) is used between bit lines or source lines of Flash cells to reduce disturbances of non-selected cells during erasing or programming of selected cells. The reason such disturbances may occur is because of the relatively large voltages that are applied to the cell bit lines or source lines during the erase and program operations. However, these STI regions typically require large silicon surface areas and reduce array layout efficiency.

Referring now to FIGS. 1a and 1b, diagrams of a prior art, Flash memory are shown. A cross section of the Flash memory cell is shown in FIG. 1a. An AND-type array architecture is shown in FIG. 1b. This Flash memory cross section is disclosed in U.S. Pat. No. 5,793,678 to Kato et al. The memory cells 10A, 10B, and 10C, comprise a floating gate 13 that is typically fabricated using the first level of polysilicon. Control gates 12 typically are fabricated using the second level of polysilicon and are connected across a row of cells in the array to form a word line. The drain regions 16 are typically formed as N-type diffusions and are connected in the array to become a bit line. The source regions 17 are also typically formed as N-type diffusions and are connected in the array to become a source line.

Each cell 10A performs a basic transistor function. However, the threshold voltage for the transistor is determined by the electron charge stored on the floating gate 13 rather than simply the ion implantation dose used during the fabrication process. When a large number of electrons are stored on the floating gate 13, then the threshold voltage of the Flash cell 10A becomes high enough to cause the cell to be in the OFF state even when a reading voltage of, for example, VDD is applied to the control gate. Conversely, if the floating gate 13 is depleted of electrons, then the threshold voltage of the cell 10A is decreased. The cell will be in the ON state when the read voltage is applied. Therefore, the threshold voltage may be used to store and to read out the stored data state.

An oxide layer 15 of typically about 10 nanometers thickness is formed between the floating gate 13 and the substrate 11. This thin oxide layer 15 is typically called the tunnel oxide because it provides an electron tunnel path during erase and program operations. A thick oxide-nitride-oxide (ONO) layer 14, of typically about 15 nanometers thickness, is formed between the floating gate 13 and the control gate 12 to thereby prevent stored electrons from migrating from the floating gate 13 to the control gate 12. Further, the ONO layer 14 provides a good coupling ratio between the control gate and the floating gate. As an important observation, a shallow trench isolation (STI) oxide layer 19 is formed in the spaces between adjacent bit lines 16 and 18 and between adjacent source lines 17 and 20. The presence of the STI regions 19 isolates the different voltages applied to the individual bit lines and source lines of cells during program or erase operations. According to current technology, the STI depth and width are about 0.30 microns and 0.25 microns, respectively. The STI regions occupy about 30 percent of the substrate surface area on a per cell basis.

Referring now to FIG. 1b, a conventional AND-type array associated with the above-described cell structure is shown.

In this array, columns of Flash memory cells 31, 33, 35, and 37, have separate bit lines 41, 43, 45, and 47. Each column also has separate source lines 42, 44, 46, and 48. Note that the bit lines and the source lines are physically separated by the STI regions located in columns 32, 34, and 36. The purpose of these STI regions 32, 34, and 36, is to prevent programming voltages applied to either the bit lines or the source lines of a selected cell from coupling onto the bit lines or source lines of unselected cells.

In order to erase and program a Flash memory cell, proper bias voltages must be applied to the control gate 12, the drain 16, and the source 17, of the selected cell 10B. Referring now to FIG. 1c, exemplary bias conditions are shown for the Flash cell of FIG. 1A during an erasing operation. During an erase, the control gates 12 of the selected cells are driven to a large, positive voltage. For example, the control gates may be driven to about +20V while the substrate is grounded and the sources and drains are either grounded or left floating. This high voltage on the control gate 12 will capacitively couple onto the floating gate 13 and will create a large electric field across the tunnel oxide layer 15. When the electric field is large enough to overcome the energy barrier of the tunnel oxide layer 15, then tunnel paths will occur to allow electron charge tunneling through the tunnel oxide layer. Tunnel electrons will migrate to the floating gate 13 and increase the threshold voltage of the selected cell.

Referring now to FIG. 1d, an exemplary bias condition for programming the Flash cell is shown. During programming, the control gates 12 of the selected cells are negatively biased to a high voltage of about 15 V. The drains 16 are positively biased to a high voltage of about +5 V in order to create a high electric field across the tunnel oxide 15. This high electric field induces electron charge flow from the floating gate 13 to the drain 16 through F-N tunneling. Because the control gate is highly biased by negative voltage, the channel of the cell will become OFF state and no current will flow. The source 17 of the cell may be left floating or may be driven to a low voltage of about +2 V to reduce the effect of drain side, high voltage on channel punch through. Typically, both positive and negative high voltages must be generated on-chip using a charge pump circuit in order to provide on-chip re-programmability. Because the program operation is performed in bit-selective fashion, the drains 16 of the non-selected cells connected to the selected bit line are coupled to the ground level rather than +5V. This low, drain bias voltage will not create a sufficiently high electric field to cause electron tunneling. Therefore, the non-selected cells will not be programmed.

It is obvious that a significant drawback of the prior art device is the STI isolation 19 required by the basic cell structure. This STI isolation 19 takes about 30% of the silicon area of the array. In addition, at least two additional process steps are required. First, the shallow trench must be etched in the silicon substrate. Second, an oxide deposition must be performed to fill the trench. These steps significantly increase the manufacturing cost.

In order to reduce the area penalty due to the STI requirements in the conventional AND-type Flash memory array, another prior art, called dual string, NOR-type Flash memory array, is disclosed in U.S. Pat. No. 5,844,270 to Kim et al. FIG. 2a shows a diagram of this prior art in cross section. Unlike the previously-described AND-type array, which separates both the bit line and the source line for each column of cells from its adjacent column of cells, the dual string, NOR-type Flash memory cell only separates the bit line. However, a common source line is shared between adjacent columns. By sharing the source line, the STI area between the source lines is eliminated, and the STI penalty is reduced to about 15% of the array. The reason that the source lines of two adjacent cells can be shared in a dual string, NOR-type array is because the source line can be either floating or positively biased to a low voltage of about 2 V during program operation. This biasing condition allows the source lines of adjacent cells to be shared without worrying about the disturb problem. However, the bit lines of adjacent cells must be separated because the voltage applied to the bit line of a selected cell would cause significant disturbance for a non-selected cell.

There is only one type of bias condition suitable for the dual string, NOR-type array. Referring now to FIG. 2c, the bias condition for an erase operation is illustrated. The control gates 22 of the selected cells are driven to a negative, high voltage of about −15 V. The source is floating and the drain of the selected cells is applied with positive, high voltage of about +5 V to erase the cells to a low threshold voltage state. Referring now to FIG. 2d, the programming operation is illustrated. During programming, the selected word line, bit line, and source line are driven with a positive, high voltage of about +10 V, a positive, middle voltage of about +5 V, and a ground level, respectively. Since the control gate is biased by a positive high voltage, the channel of the selected cell will be strongly turned ON. A large current will flow through the channel region. The current is about 300 $\mu$A to 500 $\mu$A per cell under this programming condition. This large channel current, plus the middle, high voltage level of about +5 V applied to the drain, will cause impact ionization to occur near the drain side junction. This, in turn, will cause injection into the floating gate 23. This mechanism is known as Channel-Hot-Electron (CHE) injection programming.

The advantage of CHE programming is that it is much faster than F-N programming. For example, CHE programming may only require about 10 $\mu$sec while F-N may require about 1 msec. However, the disadvantage is the large programming current. For the non-selected cells, 0 V is applied to the word line and the bit line. Therefore, the non-selected cell channel current will be zero and CHE programming will not occur. However, both CHE and F-N programming apply low voltage to the source lines of both selected and non-selected cells. Therefore, the sources of adjacent cells can be shared without causing program disturbs.

Referring again to FIG. 2a, the dual string, NOR-type array cell is shown in cross section. Flash memory cells 20B and 20C have separated drain regions 27 and 29. These drain regions 27 and 29 are separated by the STI region 29. However, the cells 20A and 20B have a commonly shared source region 26. Cells 20D and 20E have commonly shared source region 30. The shared-source cell structure of the dual string, NOR-type array significantly reduces the area penalty of the STI region 29 when compared to the AND-type array.

Referring now to FIG. 2b, a conventional array is shown for the dual string, NOR-type device. Adjacent columns 31 and 32 share a common source line 42. Similarly, adjacent columns 34 and 35 share common source line 45, and adjacent columns 37 and 38 share common source line 48. Meanwhile, all the adjacent bit lines 41, 43, 44, 46, 47 and 49 are separated from each other by STI regions 33 and 36. By sharing the source lines, the STI between the source lines can be removed and an area reduction of about 15% is realized. However, the higher integration of the dual string, NOR-type array is not complete. The remaining STI area penalty is a distinct disadvantage.

SUMMARY OF THE INVENTION

A principal object of the present invention is to provide an effective and manufacturable memory device.

A further object of the present invention is to provide a memory device having a highly integrated array of Flash cells and mask ROM cells.

A yet further object of the present invention is to place mask ROM cells in a Flash cell array by replacing STI regions between Flash cells with mask ROM cells.

Another yet further object of the present invention is to double the memory density of a Flash-based memory cell array by replacing the STI regions with mask ROM cells.

Another further object of the present invention is to provide a highly integrated Flash cell and mask ROM cell array using a range of Flash cell technologies and array architectures.

Another further object of the present invention is to provide a method to form an integrated Flash cell and mask ROM cell array with minimal change to the Flash cell process.

Another yet further object of the present invention is to provide a method to form an integrated Flash cell and mask ROM cell array that is ideally suited for developing embedded memory applications.

In accordance with the objects of this invention, a memory device is achieved. The memory device comprises an array of Flash cells and mask ROM cells in a common substrate. Each Flash cell comprises a floating gate, a control gate, a source, a drain, and a channel. Each mask ROM cell comprises a gate, a source, a drain, and a channel. Each source of the mask ROM cells is shared with one Flash cell source. Each electrode of each mask ROM cell gate is coupled to at least one Flash cell control gate. The mask ROM cell gate electrodes comprise a common layer with electrodes of the Flash cell control gates. The mask ROM cells lie in spaces between the Flash cells in the array Also in accordance with the objects of this invention, a method to form an integrated circuit memory device is achieved. The device comprises an array of Flash cells and mask ROM cells in a common substrate. Each Flash cell comprises a floating gate, a control gate, a source, a drain, and a channel. Each mask ROM cell comprises a gate, a source, a drain, and a channel. The method comprises forming sources and drains in a substrate for Flash cells and for mask ROM cells. Each of the mask ROM cell sources is shared with one of the Flash cell sources. Floating gates are formed for the Flash cells. Ions are implanted into the substrate in channels of selected mask ROM cells to alter a threshold voltage of the selected mask ROM cells. Control gates are formed for the Flash cells and gates for the mask ROM cells to complete the integrated circuit memory device. The Flash cell control gates comprise an electrode layer overlying the Flash cell floating gates with a dielectric layer therebetween. Electrodes of each mask ROM cell gate are coupled to at least one of the Flash cell control gates. The mask ROM cell electrodes comprise the Flash cell control gate electrode layer. The mask ROM cells lie in spaces between the Flash cells in the array.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a highly-integrated memory array comprising Flash cells and mask ROM cells. The novel device places mask ROM cells in spaces between Flash cells to thereby double the memory capacity without increasing the array size. A method for forming the integrated Flash and mask ROM array is disclosed. It should be clear to those experienced in the art that the present invention can be applied and extended without deviating from the scope of the present invention.

The present invention provides a novel approach to achieve much higher integration over the prior art. The present invention provides Flash memory with mask ROM memory where the same density of Flash memory can be achieved without an area penalty. In addition, the present invention provides a novel approach to integrate Flash memory and mask ROM memory onto a single chip without a major process change. Therefore, the present invention provides an ideal solution for flash storage card applications or for system-on-chip (SOC) applications that generally require the integration of both Flash memory and mask ROM onto a single chip.

Figure 1A:
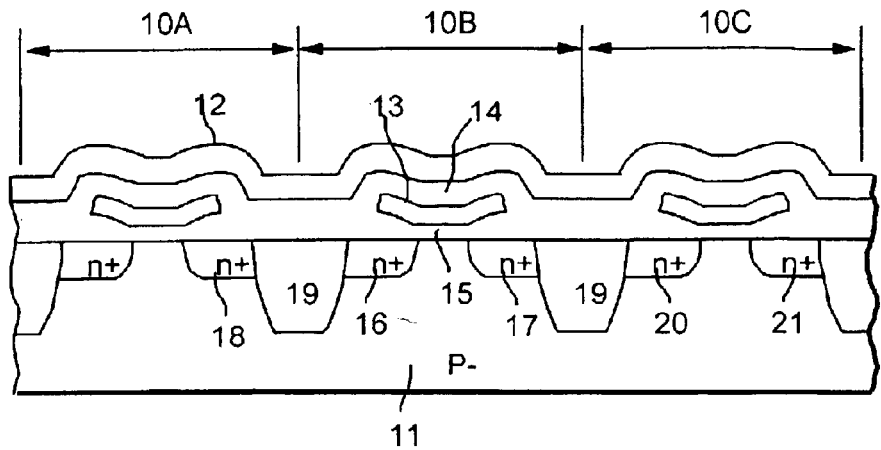
FIGS. 1a and 1b illustrate a prior art, AND-type Flash memory cell cross section and memory array.
Figure 1B:
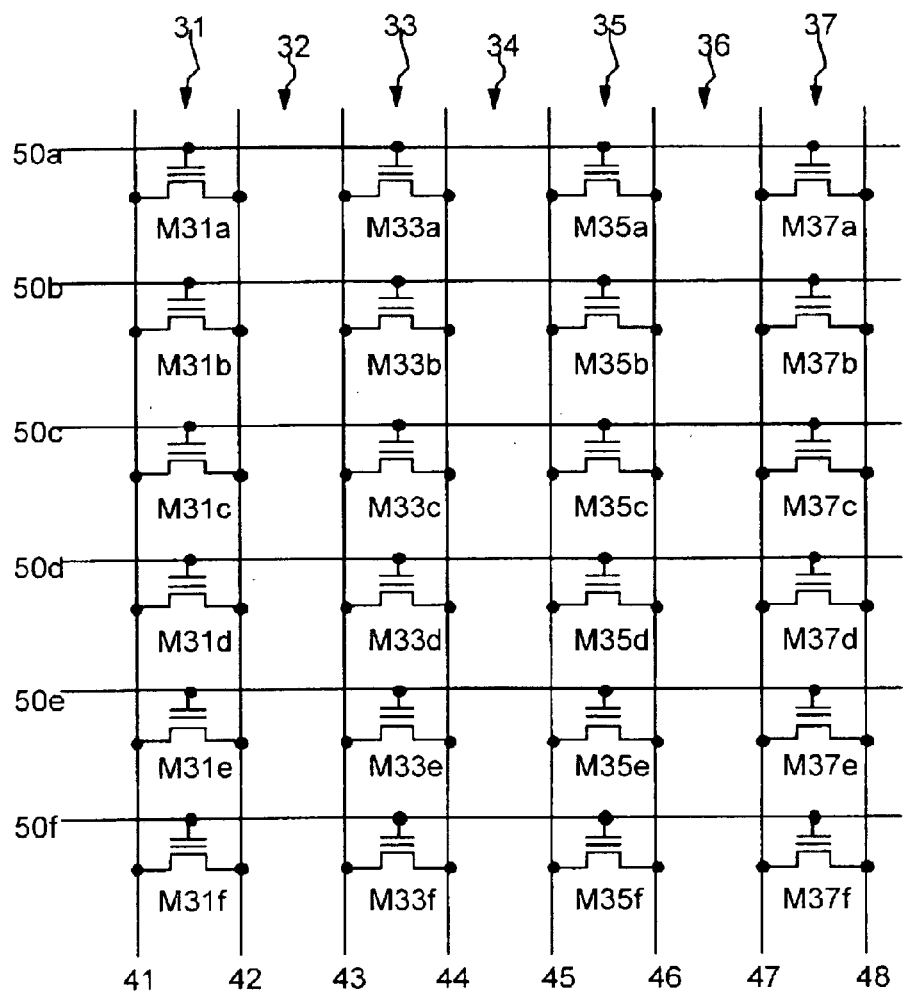
Figure 1C:
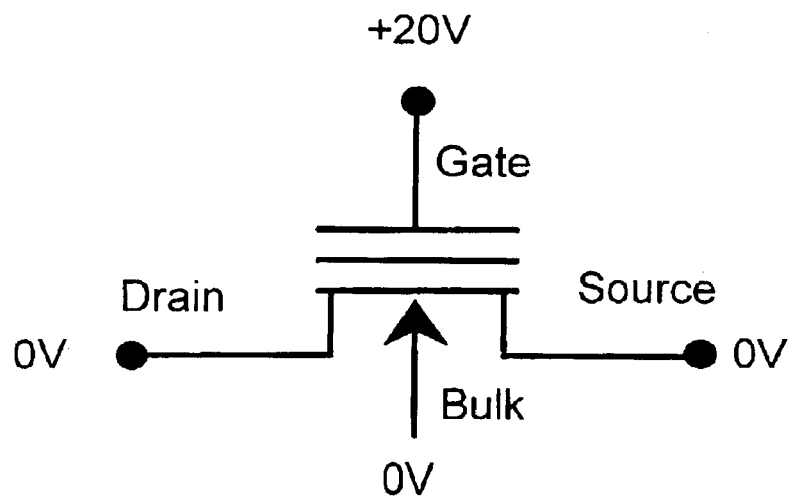
FIGS. 1c and 1d illustrate exemplary bias conditions for erase and program, respectively, of the prior art, AND-type Flash memory cell.
Figure 1D:
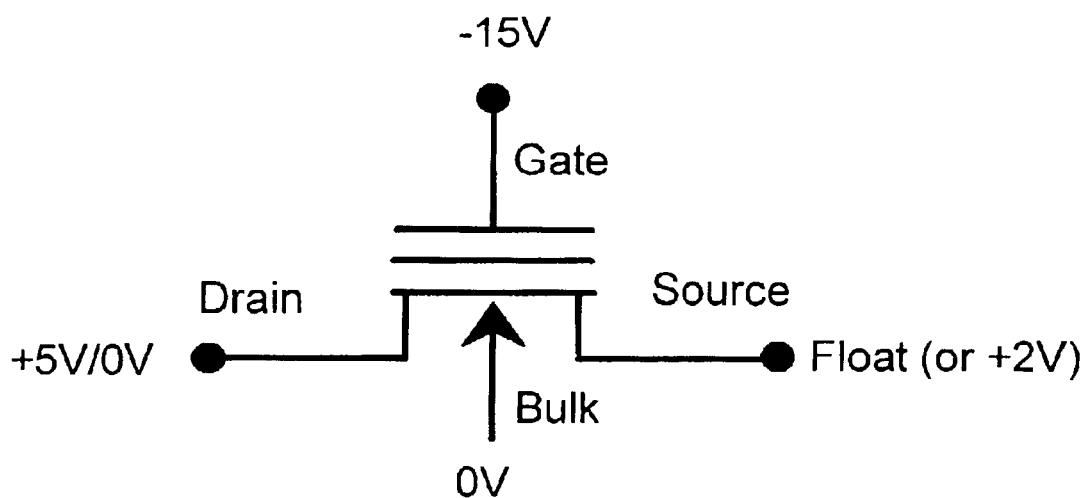
Figure 2A:
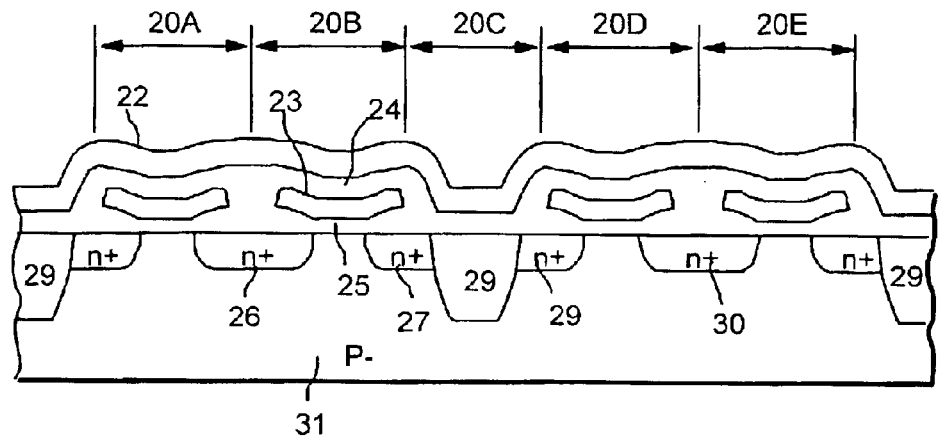
FIGS. 2a and 2b illustrate a prior art, dual string, NOR-type Flash memory cell cross section and memory array.
Figure 2B:
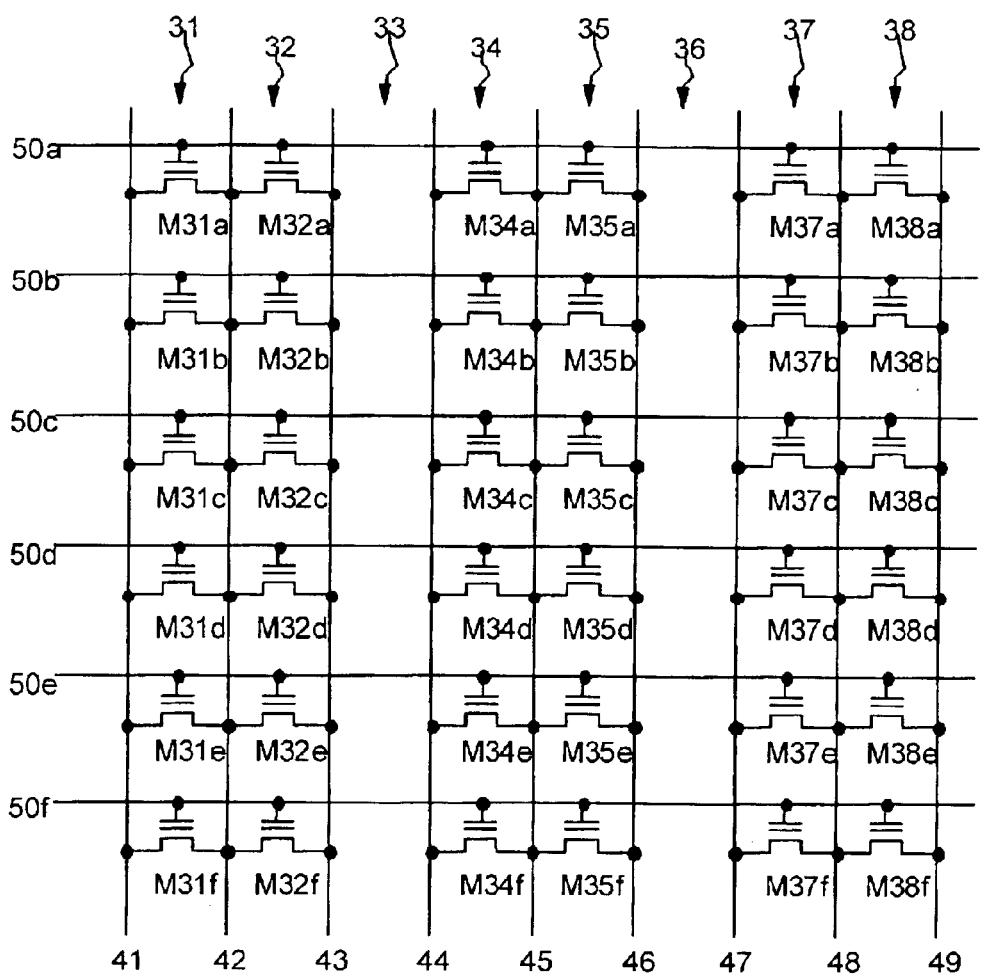
Figure 2C:
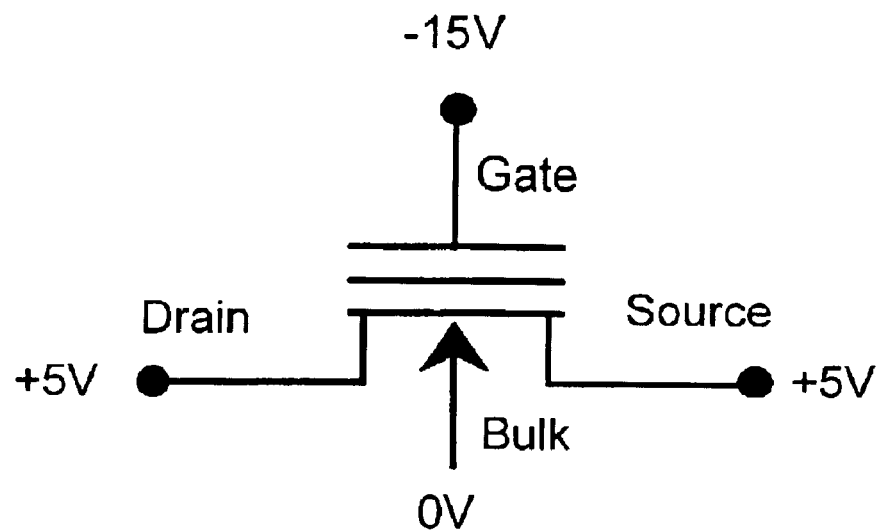
FIGS. 2c and 2d illustrate exemplary bias conditions for erase and program, respectively, of the prior art, dual string, NOR-type Flash memory cell.
Figure 2D:
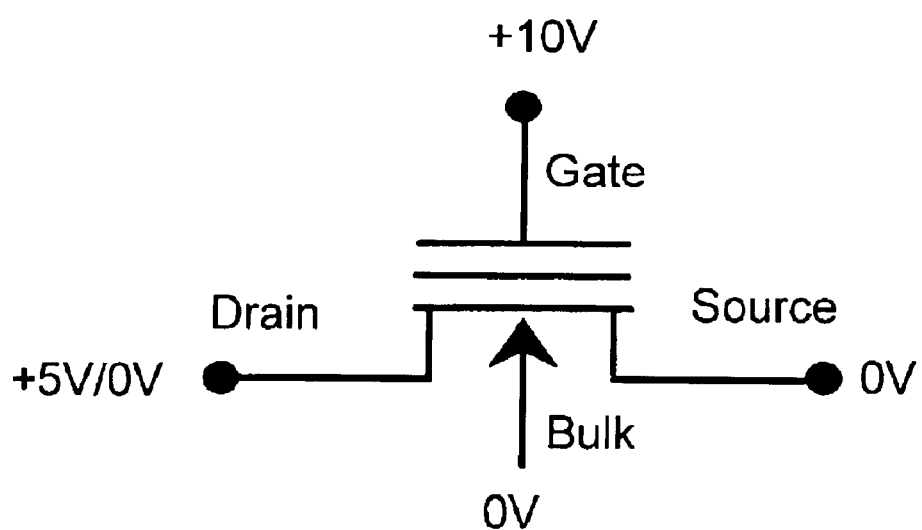
Figure 3A:
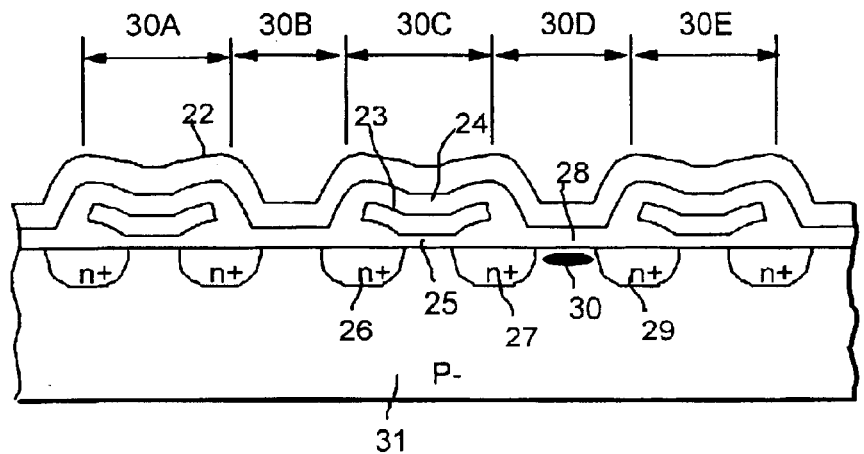
FIGS. 3a and 3b illustrate a first preferred embodiment of the present invention showing Flash memory cells and mask ROM cells in cross section and in a combination memory array. The first preferred embodiment is an AND-type array.

Referring now to FIG. 3a, a first preferred embodiment of the present invention is illustrated. Several important features of the present invention are illustrated. In the most general form, the memory device comprises an array of Flash cells 30A, 30C, and 30E, and of mask ROM cells 30B and 30D in a common substrate 31. Each Flash cell 30C comprises a floating gate 23, a control gate 22, a source 27, a drain 26, and a channel. Each mask ROM cell 30D comprises a gate 22, a source 27, a drain 29, and a channel. Each source 27 of the mask ROM cells 30D is shared with one Flash cell 30C source 27. Each electrode 22 of each mask ROM cell gate is coupled to at least one Flash cell 30C control gate 22. The mask ROM cell 30D gate electrodes comprise a common layer 22 with electrodes of the Flash cell 30C control gates. Finally, the mask ROM cells 30B and 30D lie in spaces between the Flash cells 30A, 30C, and 30E in the array.

The diagram shows an exemplary Flash memory array consisting of three cells 30A, 30C, and 30E. The first embodiment comprises an AND-type array. Of special importance is how the area between adjacent Flash memory cells is used. In the prior art device, STI regions were formed between adjacent Flash memory cells. However, the present invention constructs mask ROM cells 30B and 30D between the Flash cells 30A, 30C, and 30E. The novel approach allows formation of a highly integrated memory array comprising Flash cells and mask ROM cells.

Figure 13A:
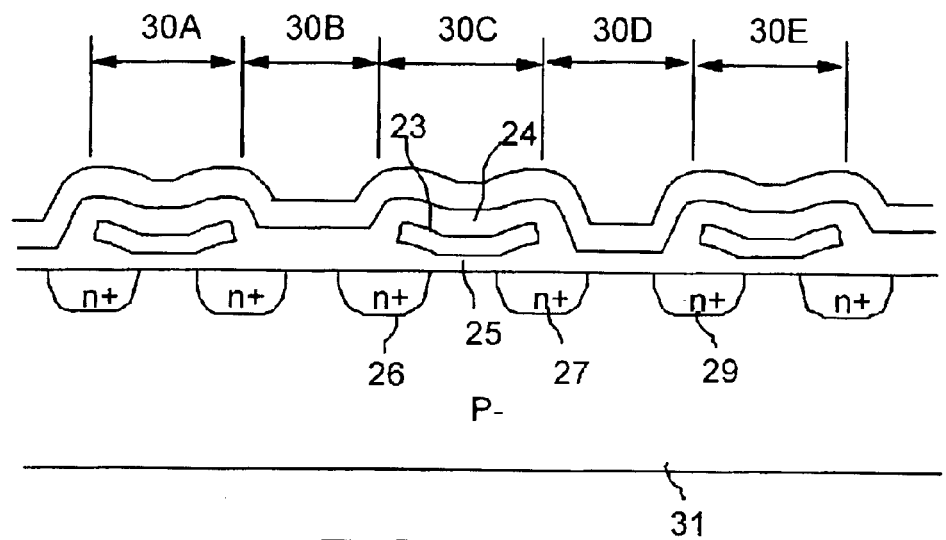
FIGS. 13a through 13d illustrate the preferred embodiment method of forming the memory array having Flash cells and mask ROM cells.

Referring now to FIG. 13a, a preferred embodiment method of forming the above-described memory array having Flash cells and mask ROM cells is illustrated. Several important features of the present invention are shown. The method comprises forming sources 27 and drains 26 for Flash cells 30A, 30C, and 30E, and sources 27 and drains 29 for mask ROM cells 30B and 30D in a substrate 31. Each of the mask ROM cell 30D sources 27 is shared with one of the Flash cell 30C sources 27. The source and drain regions may be formed by implanting ions into the substrate 31 as is well known in the art.

As an important feature, the conventional STI regions are not formed between the Flash cells 30A, 30C, and 30E. Instead, the regions in the substrate 31 between the Flash cells are defined as active areas. This is an important feature of the present invention for two reasons. First, by defining the spaces between the planned Flash cells as active areas, these areas may be used for the planned mask ROM cells. Second, by eliminating the STI regions, the STI process steps of trench etching, oxide formation, and planarization may also be eliminated. The STI regions may be eliminated because the novel array architecture of the present invention does not require isolation between adjacent columns of Flash cells.

Floating gates 23 are formed for the Flash cells 30C. The floating gates comprise an electrode layer 23 overlying the substrate 31 with a tunnel oxide layer 25 therebetween. The tunnel oxide layer 25 is formed by deposition or by oxidation to form a very thin film of about 10 nanometers. The electrode layer 23 preferably comprises polysilicon that is deposited overlying the electrode layer 23. The electrode layer 23 is then patterned by known methods to form the floating gates 23 of the Flash cells. As will be discussed below, the floating gates may be patterned into various configurations depending upon the technology.

A dielectric layer 24 for the control gates is then deposited overlying the floating gates 23. This dielectric layer 24 may be called a control gate dielectric layer (IDL). The control gate dielectric layer 24 preferably comprises an oxide-nitride-oxide film (ONO) that is deposited to a thickness of about 15 nanometers. The control gate dielectric layer 24 isolates the floating gates 23 from the subsequently formed control gate while providing good capacitive coupling.

Figure 13B:
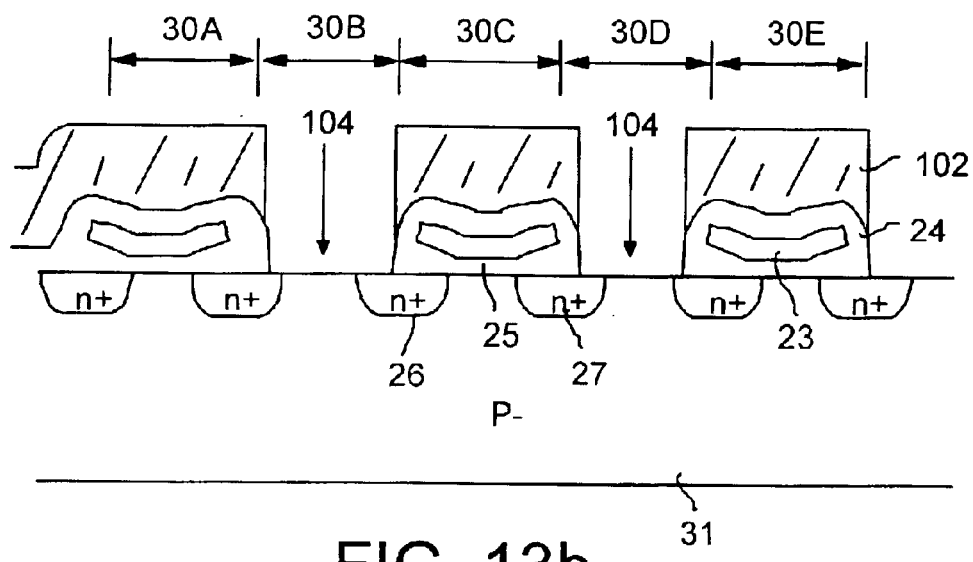

Referring now to FIG. 13b, an important, but optional, feature of the method of formation is shown. Following the deposition of the control gate dielectric layer 24, this dielectric layer 24 may be patterned to remove the dielectric layer 24 where mask ROM cells are planned 104. It may be necessary to remove the dielectric layer 24 to form mask ROM cells 30B and 30D having preferred current capability or voltage performance. The dielectric layer 24 is patterned by, for example, depositing a photoresist coating 102, exposing the photoresist coating 102 through a mask, developing the photoresist coating 102, and then etching away the dielectric layer 24 where the mask ROM cells are planned 104. If this step is not performed, the control gate dielectric layer 24 will be used as the gate dielectric layer for the mask ROM devices.

Figure 13C:
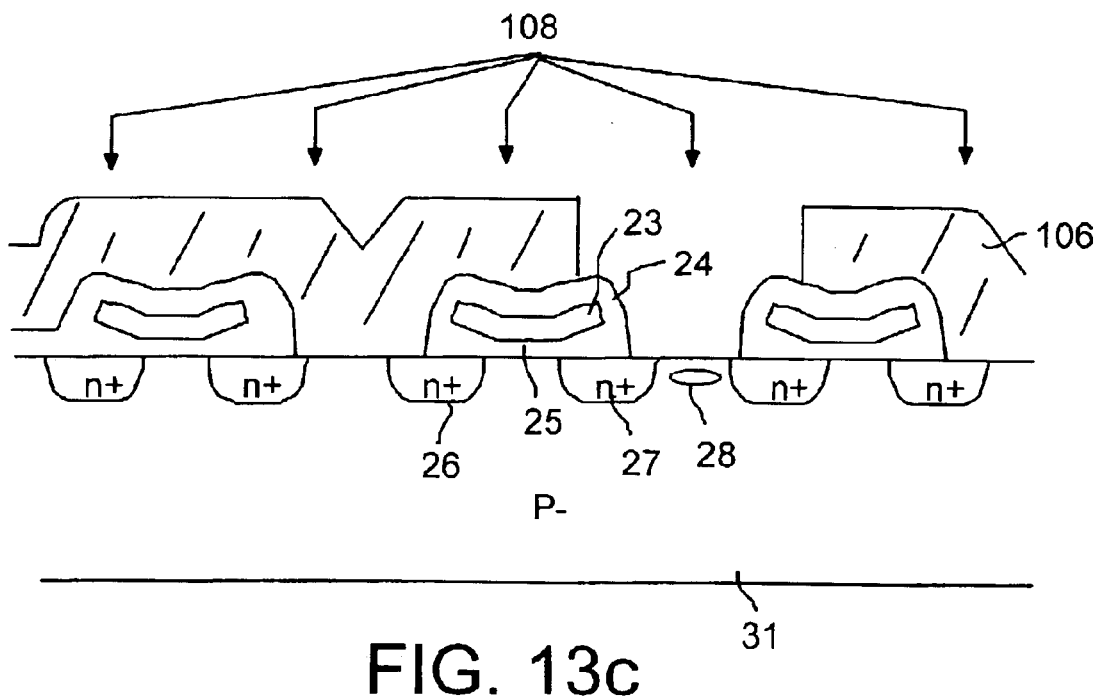

Referring now to FIG. 13c, ions are implanted 108 into the substrate 31 in channels 28 of selected mask ROM cells 30D to alter the threshold voltage of the selected mask ROM cells 30D. Doping the channels 28 will increase or decrease the voltage threshold of the mask ROM devices. By performing the implantation 108 in a selective fashion, the ROM array can be permanently programmed to a specified pattern. Some ROM cells 30D are implanted, while other ROM cells 30B are not implanted. A photoresist layer 106 may be deposited and patterned prior to the ion implantation to achieve the selectivity.

Figure 13D:
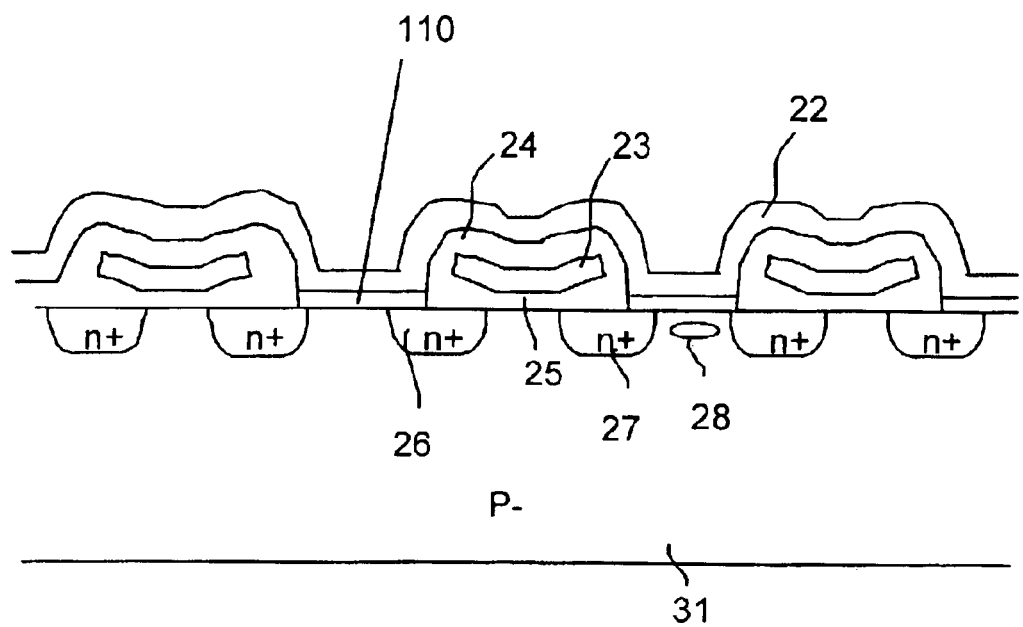

Referring now to FIG. 13d, control gates 22 are formed for the Flash cells 30A, 30C, and 30D, and gates 22 are formed for the mask ROM cells 30B and 30D to complete the integrated circuit memory device. The Flash cell control gates comprise an electrode layer 22 overlying the Flash cell floating gates 23 with the dielectric layer 24 therebetween. The mask ROM cell 30D gates comprise the control gate electrode layer 22 overlying the substrate 31 with a mask ROM gate dielectric 110 therebetween.

The mask ROM gate dielectric 110 preferably comprises a thin oxide layer that is formed by deposition or by oxidation overlying the substrate 31. The Flash cell electrode layer 22 is deposited overlying the dielectric layer 24 and the mask ROM gate dielectric layer 110. The Flash cell electrode layer 22 preferably comprises a polysilicon layer 22. The Flash cell electrode layer 22 is then patterned to form control gates, ROM gates, and interconnects.

It is important to note that the electrodes of each mask ROM cell 30D gate are coupled to at least one of the Flash cell 30C control gates. Further, the mask ROM cell 30D electrodes comprise the Flash cell 30C control gate electrode layer 22. Finally, the mask ROM cells 30D lie in spaces between the Flash cells 30C in the array.

Figure 3B:
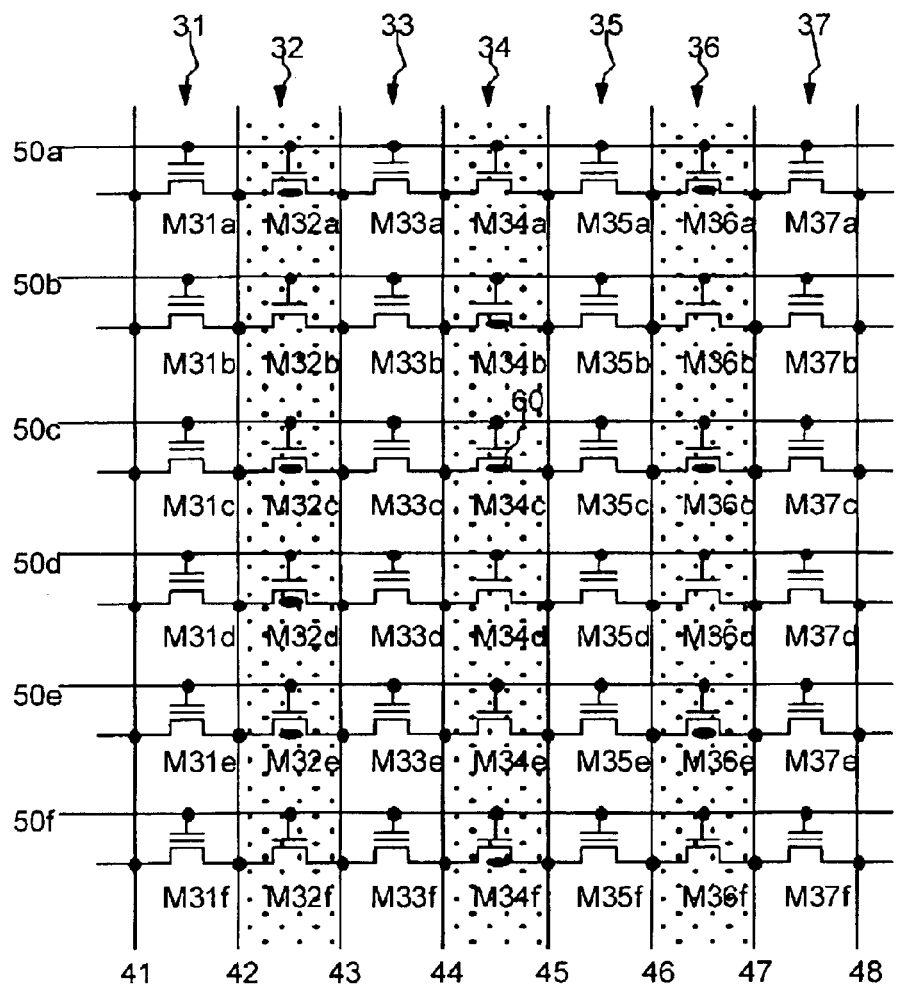

Referring again to FIG. 3b, the architecture of an array of AND-type Flash cells of the first preferred embodiment is shown. The array shows the significant advantage of the invention over the prior art in terms of integration of the two types of memory devices into a single array. In the same silicon area, in addition to the original Flash memory cells 30A, 30C, and 30E, the present invention forms two extra mask ROM cell columns 30B and 30D where the prior art formed STI. The illustration shows that an equal density of mask ROM cells can be formed in addition to the original Flash cells without increasing the silicon area. Therefore, a memory device having equal numbers of Flash cells and mask ROM cells can be formed using the prior art silicon area. If, for example, a 64 Mbyte Flash memory is considered, then an extra 64 Mbyte mask ROM array can be formed in the original 64 Mbyte Flash memory array area without an area penalty. Therefore, extremely high integration is achieved.

The mask ROM cells 30B and 30D are programmed using a masking ion implantation as described above. By comparison, the Flash cells 30A, 30C, and 30E, are programmed electrically, on-chip, after the completed chip is sent to the customer. To program a mask ROM cell to a high threshold voltage, for example, a properly determined dose concentration of Boron impurity is implanted into the mask ROM channel region 30. The presence of the boron impurity ions increases the threshold voltage of the ROM cell to turn OFF the cell 30D during a read operation. The threshold voltage of a non-implanted cell 30B is lower, and the cell 30B will be ON during a read operation.

Referring again to FIG. 3b, the AND-type Flash cell and mask ROM cell array comprises a plurality of columns 31, 33, 35, and 37, of Flash memory cells and a plurality of columns 32, 34, and 36, of mask ROM cells between adjacent columns of Flash memory cells. Note that some mask ROM cells M34b, M34c, and M34f, are programmed to a high threshold voltage while other cells are not so programmed.

Figure 4A:
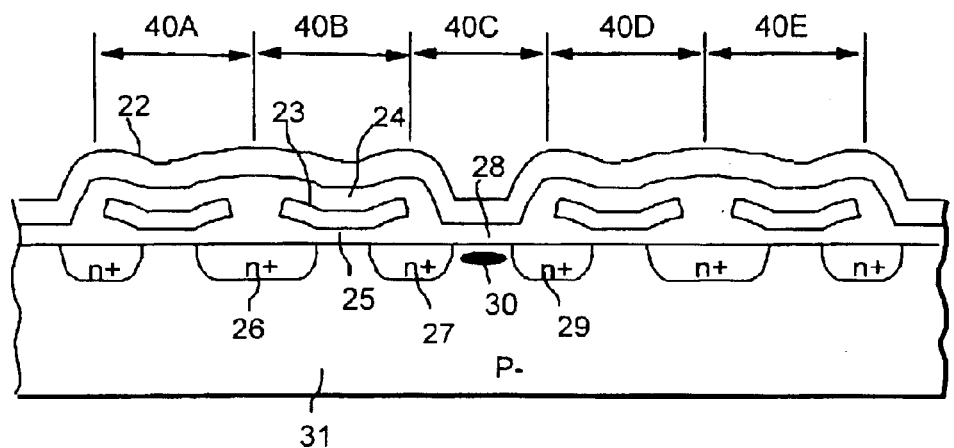
FIGS. 4a and 4b illustrate a second preferred embodiment of the present invention showing a Flash memory cells and mask ROM cells in cross section and in a memory array. The second preferred embodiment is a dual string, NOR-type array.
Figure 4B:
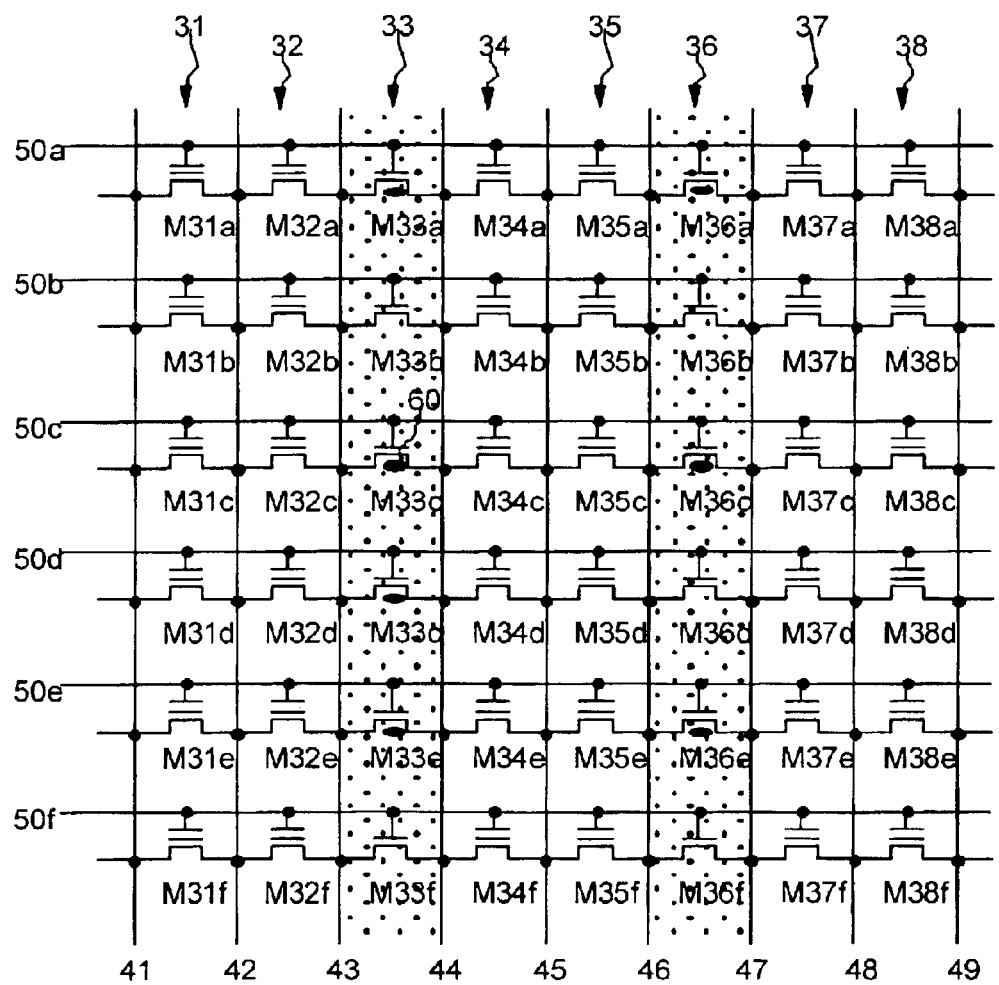

Referring now to FIGS. 4a and 4b, a second preferred embodiment of the present invention is illustrated. Flash memory cells and mask ROM cells are shown in cross section and in a memory array. The second preferred embodiment is a dual string, NOR-type array. In this embodiment, the extra mask ROM cell 40C is integrated into the original STI region of the prior art dual string, NOR-type cell. The mask ROM cell 40C is located between two adjacent drain regions 27 and 29 of the Flash cells 40B and 40D. The mask ROM cell 40C comprises a control gate 22, a drain region 27, and a source region 29. The mask ROM cell shares the control gate 22, the drain, or bit line, and the source, or source line, with the adjacent Flash memory cells 40B and 40D. The second embodiment device is formed using the same method as discussed above for the first embodiment. Again, the ONO layer 24 may be removed from the mask ROM cell 40C and replaced with a mask ROM gate dielectric prior to formation of the control gate electrode layer 22. The mask ROM cells are programmed by ion implantation 30 as described above.

Referring now to FIG. 4b, the configuration of the dual string, NOR-type Flash cell and mask ROM cell array is shown. The array comprises a plurality of columns of Flash cells 31, 32, 34, 35, 37, and 38, and a plurality of columns of mask ROM cells 33 and 36. The STI regions of the prior art, dual string, NOR-type array are replaced with mask ROM devices 33 and 36. Some mask ROM cells M33a, M33c, M33e, M36a, M36c, and M36e, are programmed by ion implantation. Other cells are not programmed.

As an important point, the Flash cells of the first and second embodiments are formed using a stacked gate type of cell. However, other types of Flash memory cells could be used to create the novel, integrated Flash cell and mask ROM cell memory device of the present invention while remaining within the scope of the present invention. For example, the teachings of the present invention may be extended to metal-oxide-nitride-oxide-silicon (MONOS) type Flash memory cells or to split-gate cells.

Figure 5A:
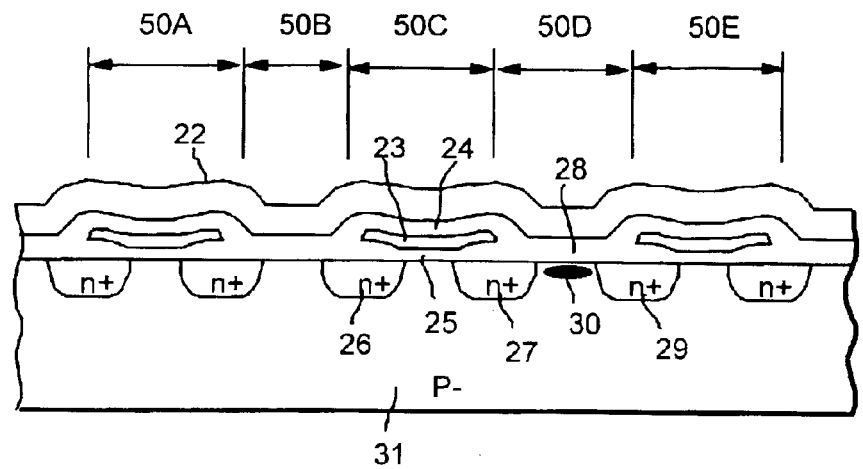
FIGS. 5a and 5b illustrate a third preferred embodiment of the present invention showing Flash memory cells and mask ROM cells in cross section and in a memory array. The third preferred embodiment is a MONOS-type Flash cell.
Figure 5B:
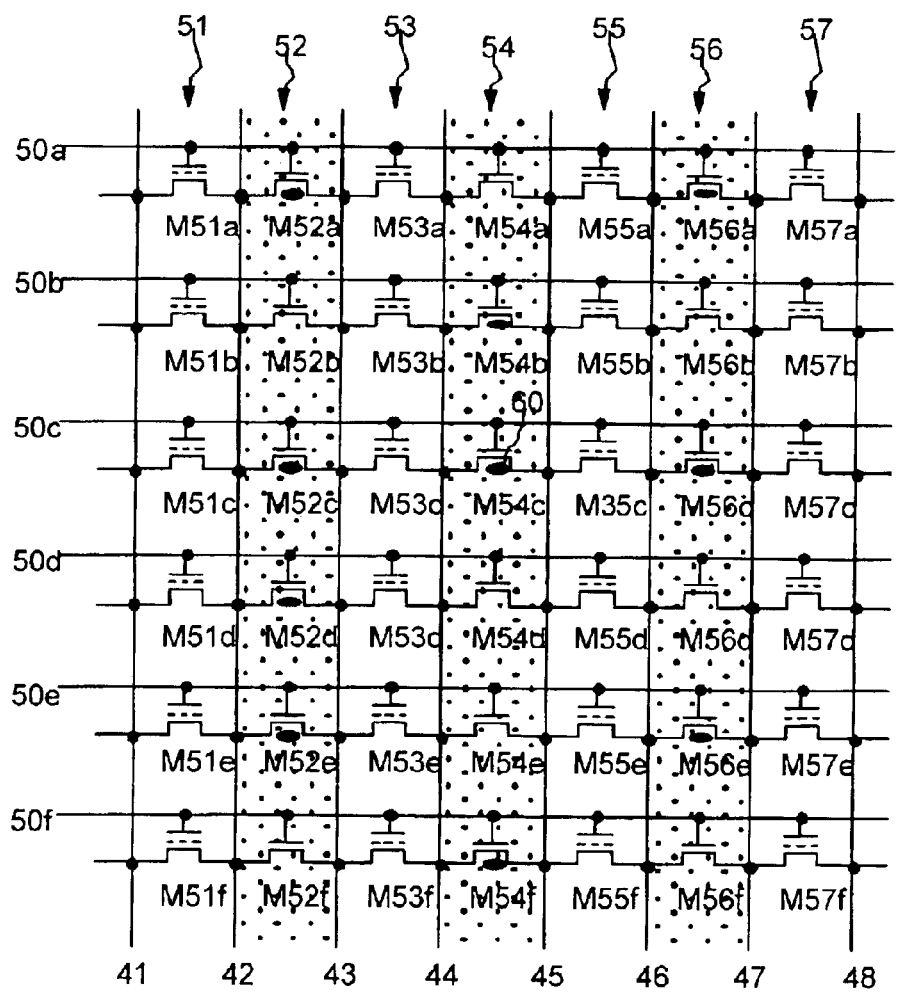

Referring now to FIGS. 5a and 5b, a third preferred embodiment of the present invention is illustrated. Flash memory cells 50A, 50C, and 50E, and mask ROM cells 50B and 50D are shown in cross section and in a memory array. The third preferred embodiment is a MONOS-type Flash cell. This embodiment is similar to the first embodiment as shown in FIG. 3a. However, in the third preferred embodiment, the Flash cells are formed as MONOS-type cells. In the MONOS cell, there is no true floating gate. The floating gate layer 23 comprises a nitride layer. A stack of oxide-nitride-oxide (ONO) is used to form the control dielectric 24, quasi-floating gate 23, and tunnel oxide 25.

The MONOS cell acts as an electron charge trap. The thinner oxide layer 25 allows electron charge to tunnel through when sufficient electric field is applied across it. The top oxide layer 24 prevents trapped electron charge from further migrating through to the control electrode 22. During programming, the Flash memory cell 50C is biased to cause electron tunneling. A true, floating gate, Flash cell, is typically fabricated with a conductive material such as polysilicon. However, the MONOS device is fabricated with a nitride layer that is essentially a n insulator. The trapped electron charge is therefore not able to freely move in the nitride, floating gate. The MONOS-type of Flash cell provides the capability of storing two bits per cell by trapping the electron charge in different physical locations of the nitride layer 23. The architecture for the MONOS-type Flash cell and mask ROM cell array is shown in FIG. 5b.

In the previous exemplary embodiments of the present invention, the STI regions of the conventional Flash memory array are all removed and replaced by mask ROM cells to achieve high-scale integration. However, due to the high voltage requirement of the Flash memory cells during erase and program operations, the mask ROM cell channel length must be optimized to prevent voltage breakdown. Typically, a shorter channel length device will exhibit a lower gate-aided, breakdown voltage than a longer channel length device.

Referring again to FIG. 3a, in the first preferred embodiment array each bit line and source line is shared by adjacent Flash cells and mask ROM cells. For example, bit line 27 is shared by adjacent Flash cell 20C and mask ROM cell 20D. Therefore, mask ROM cell 20D will be exposed to the high voltage applied to the bit line and will suffer high voltage stress. To compensate for this effect, the channel length of the ROM cell 20C must be made long enough to sustain the high voltage stress without damage. Alternatively, processing parameters can be optimized to account for this effect.

Figure 6A:
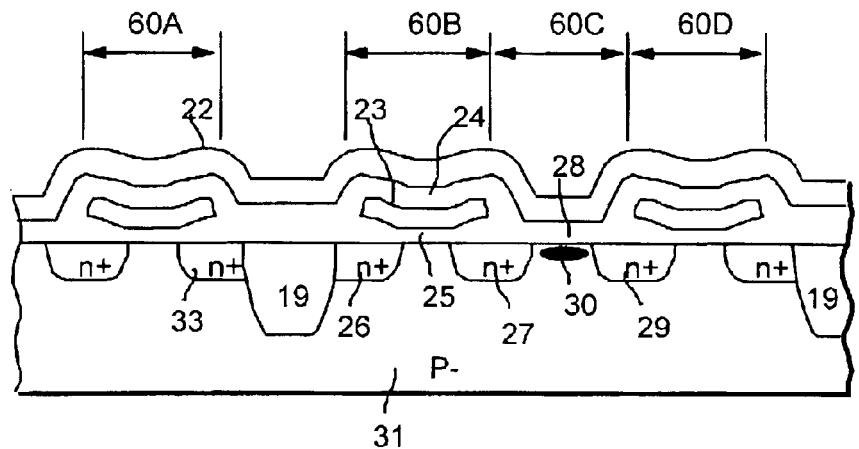
FIGS. 6a and 6b illustrate a fourth preferred embodiment of the present invention showing Flash memory cells and mask ROM cells in cross section and in a memory array. The fourth preferred embodiment is a hybrid-type array where mask ROM cells are formed on the source side of the Flash cell but not on the drain side.
Figure 6B:
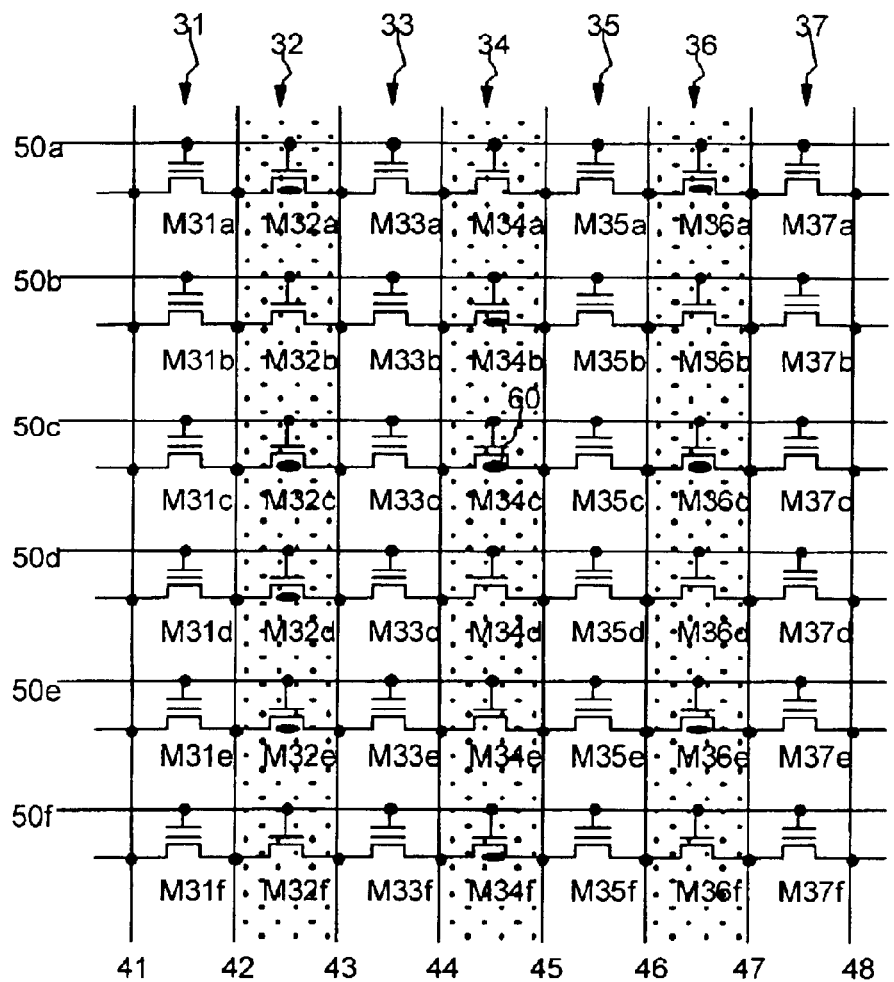

Referring now to FIGS. 6a and 6b a fourth preferred embodiment of the present invention is illustrated. Flash memory cells 60A, 60B, and 60D and a mask ROM cell 60C are shown in cross section and in a memory array. The fourth preferred embodiment is a hybrid-type array where mask ROM cells 60C are formed on the source side 27 of the Flash cells 60B and 60D but not the drain side 26. In this embodiment, only the source 27 side STI is removed and replaced by a mask ROM cell 60C. The drain side STI 19 is kept in place to isolate the drain regions 26 and 33 of the adjacent Flash cells 60A and 60B. When programming the Flash cell 60B, a positive, high voltage of about 5 V and a negative, high voltage of about −15 V are applied to the drain 26 and to the control gate 22, respectively. This bias condition will cause electron charge to tunnel from the floating gate 23 to the drain 26. In the meantime, the source 27 of the cell can be kept in a floating or a low bias condition. This will keep the Flash cell 60B channel from experiencing punch-through due to the high drain bias.

Because the high voltage is only applied to the drain side 26, and because the source side 27 is kept at a low voltage, the mask ROM cell 60C of the fourth embodiment does not experience the high programming voltage. Therefore, the mask ROM cell 60C does not have to have a long channel length or special process parameters such as a thicker gate oxide. In addition, the process can be independently optimized for Flash cell performance without effecting the ROM cell short channel performance.

Figure 7A:
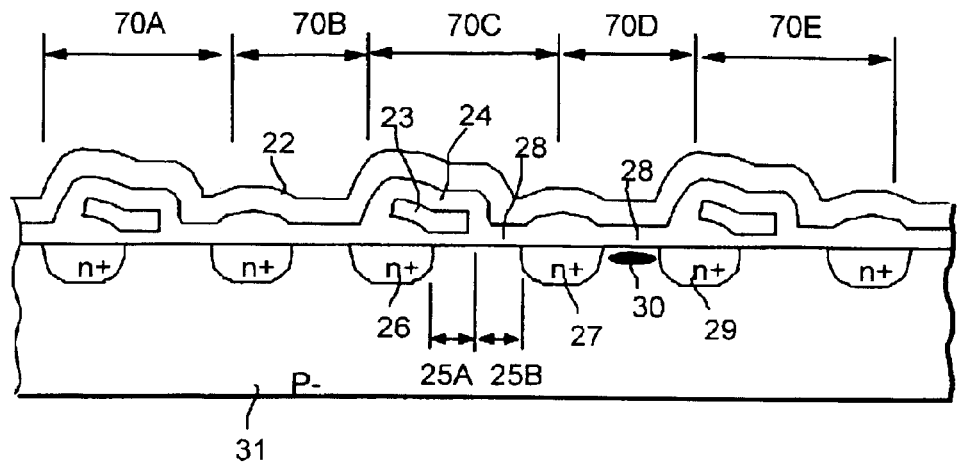
FIGS. 7a and 7b illustrate a fifth preferred embodiment of the present invention showing Flash memory cells and mask ROM cells in cross section and in a memory array. The fifth preferred embodiment is a split-type Flash cell.
Figure 7B:
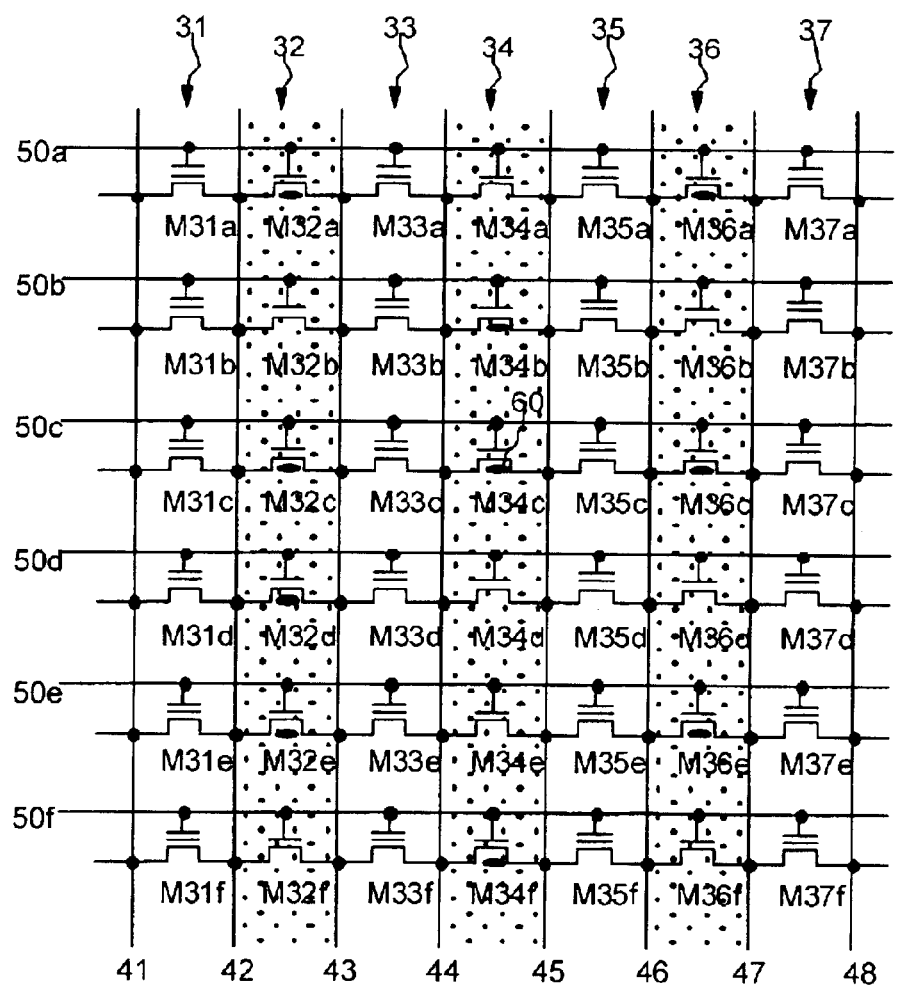

Referring now to FIGS. 7a and 7b, a fifth preferred embodiment of the present invention is illustrated. Flash memory cells 70A, 70C, and 70E, and mask ROM cells 70B and 70D are shown in cross section and in a memory array. The fifth preferred embodiment is a split-type Flash cell. In a split-gate Flash cell 70C, the floating gate 23 only overlies a part 25A of the Flash cell channel. The second part of the channel 25B has a control gate 22 but not a floating gate 23. One advantage of the split-gate Flash memory cell is the avoidance of an over-erase condition. Over-erasing occurs in a stacked-type Flash cell array such as an AND-type or a NOR-type array. The stacked-gate cell is supposed to be turned ON or OFF during a read operation based on the threshold voltage of the cell. This threshold voltage is determined by the amount of electron charge stored on the floating gate. Unfortunately, if too much electron charge is removed from the floating gate, then the threshold voltage will become negative. This is called an over-erase condition. In the over-erase condition, the cell will conduct current even when the cell is non-selected.

During a normal read operation, a pre-determined positive, word line voltage, typically the chip power supply VDD, is applied to the gates of the selected memory cell. Meanwhile, the gates of non-selected cells are coupled to the ground level. A current-mode sense amplifier is then used to measure the current of cells coupled to the bit line of the selected cell. Since non-selected cells should not conduct, this method is effective for determining the state of the selected cell. However, if there exists an over-erased cell on the same bit line, then this cell will interfere with the current sense operation and will cause the sense amplifier to mistakenly detect an ON-state cell even when the selected cell is OFF-state. A data error will result.

The split-gate type of Flash memory cell can effectively shut OFF the leakage current of over-erased cells. Therefore, split-gate cells are highly attractive in some applications that require fast erase operations. This is because fast erase operation leads to reduced controllability of erased cell threshold voltage. Reducing the erase time typically increases the number of over-erased cells.

The split-gate cell 70C preferably comprises half of the channel length 25A as a floating gate transistor and half of the channel length 25B as a normal enhancement MOS transistor. Therefore, the split-gate cell 70C acts like two transistors in series. Even if the floating gate side 25A of the Flash cell is over-erased to a negative threshold voltage, the enhancement side 25B will still be turned OFF by the non-selected cell voltage on the control gate. Therefore, the split-gate Flash cell will not conduct in the non-selected state due an over-erase condition.

For these reasons, the split-gate type of Flash cell is particularly suitable for embedded applications that use fast erase operations. Referring now to FIG. 7B, the preferred architecture of the split-gate Flash and mask ROM array is shown.

Figure 8:
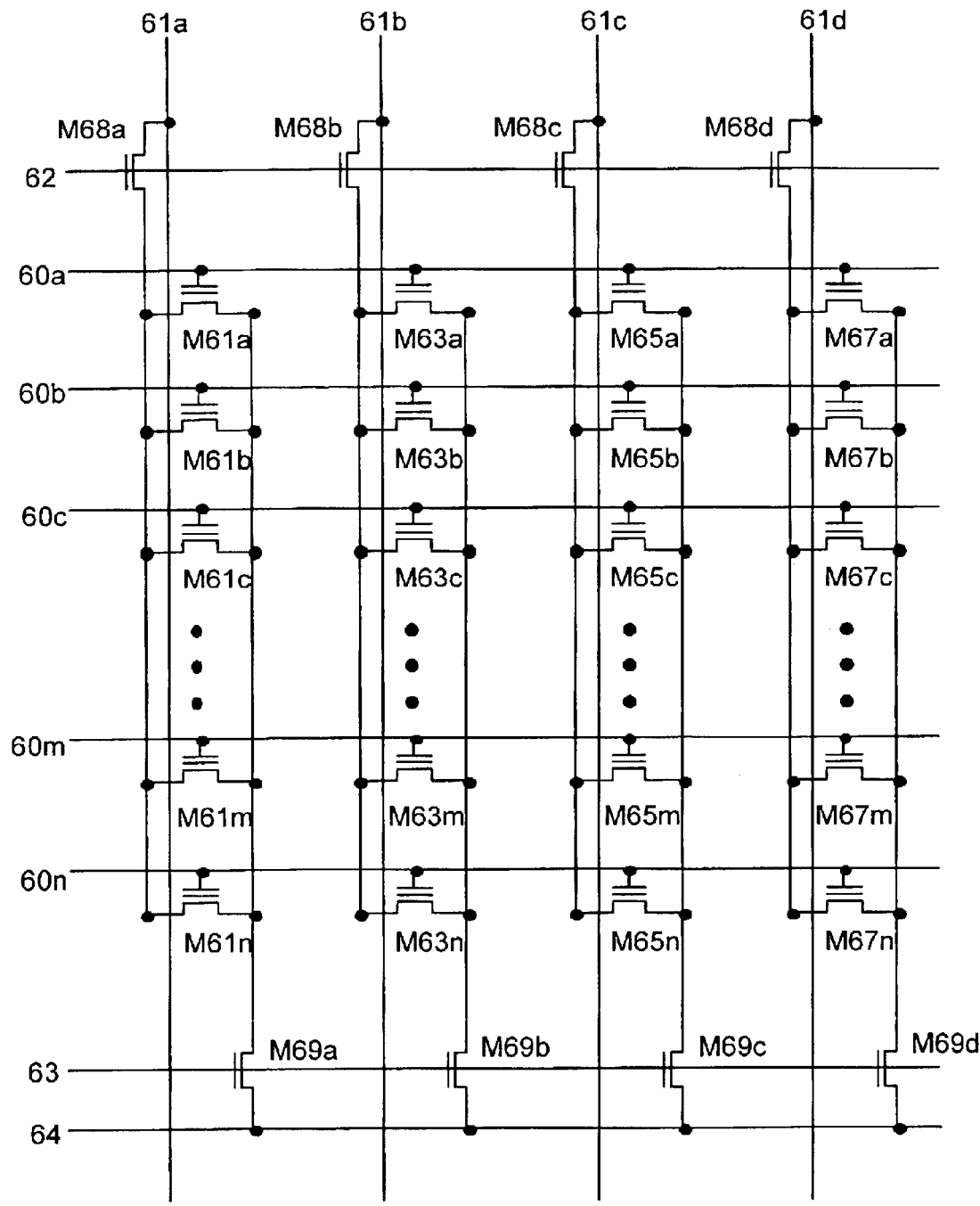
FIG. 8 illustrates a prior art, AND-type Flash memory array with a more detailed array structure.

Referring now to FIG. 8, a prior art, AND-type Flash memory array is shown with a more detailed array structure. Main bit line, sub-bit line, and sub-bit line select transistors are shown. The conventional array comprises a plurality of main bit lines 61A, 61B, 61C, and 61D, a horizontal main source line 64, bit line select transistors M68A to M68D, and source line select transistors M69A to M69D.

Figure 9:
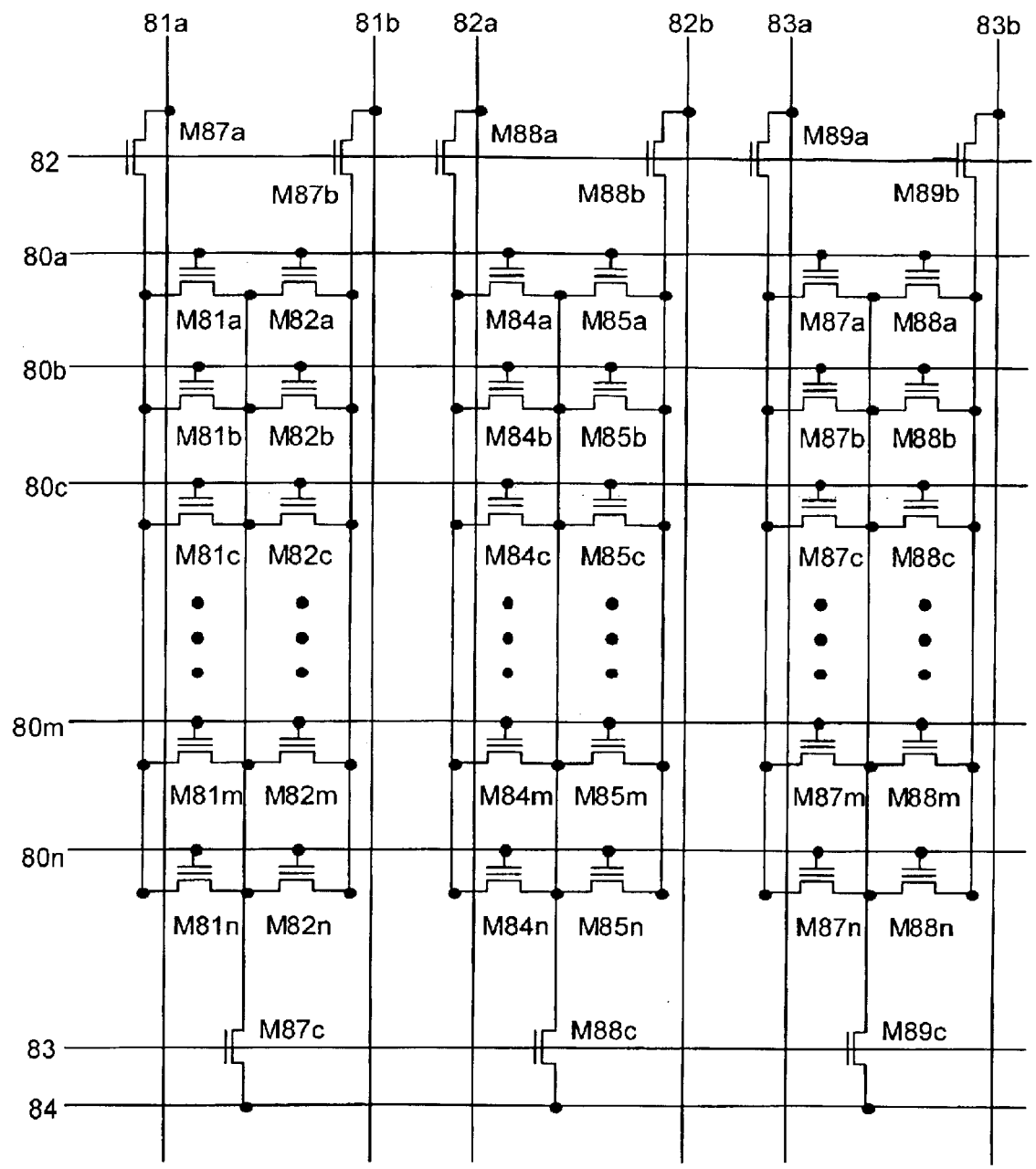
FIG. 9 illustrates a prior art, dual string, NOR-array Flash memory array with a more detailed array structure.

Referring now to FIG. 9, a prior art, dual string, NOR-type Flash memory array is shown with a more detailed array structure. The array comprise a plurality of main bit line pairs 81A and 81B, 82A and 82B, 83A and 83B, a horizontal main source line 84, bit line select transistors M87A to M89B, and source line select transistors M87C, M88C, and M89C.

Figure 10:
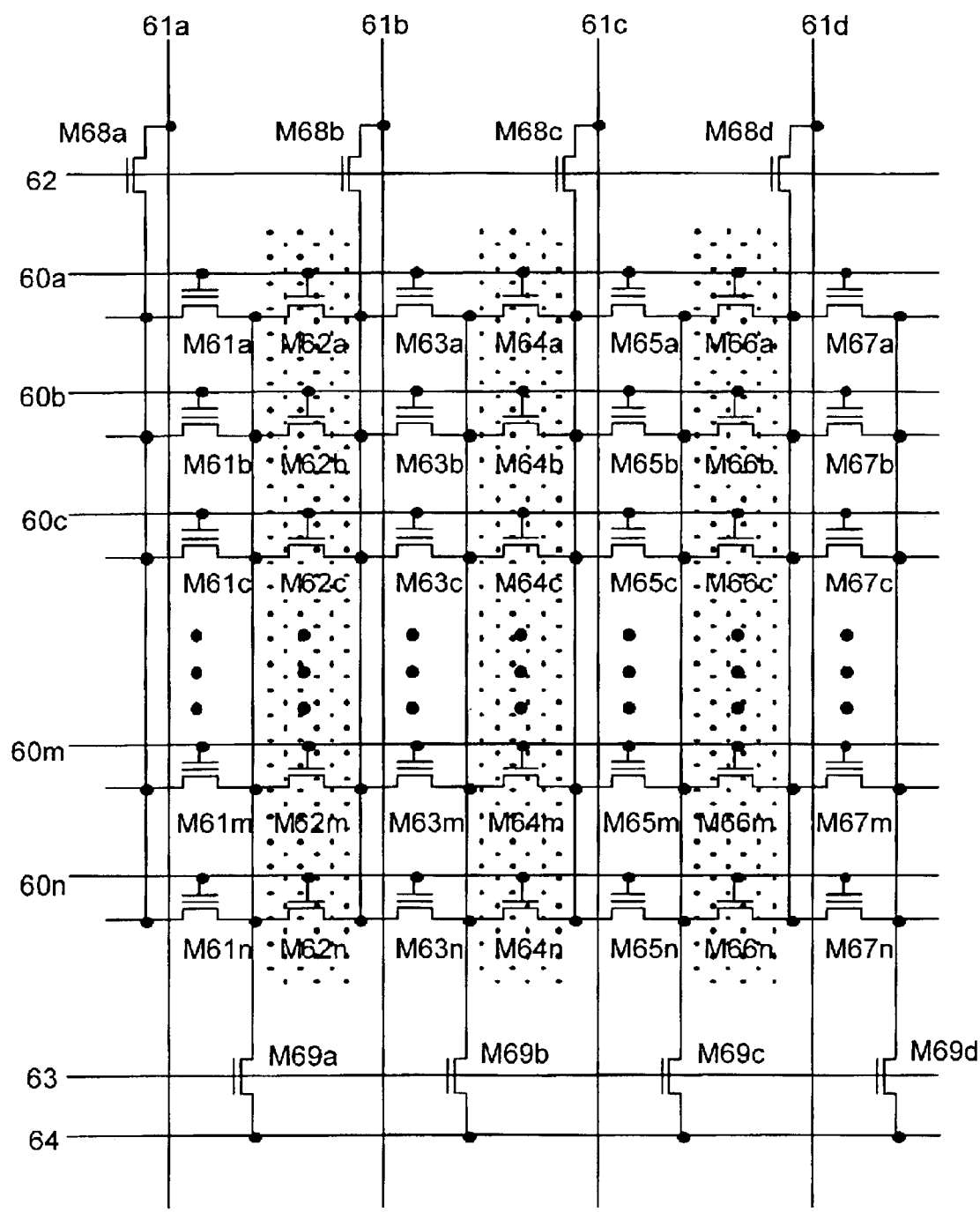
FIGS. 10 and 11 illustrate the first embodiment further by showing a more detailed array structures.
Figure 11:
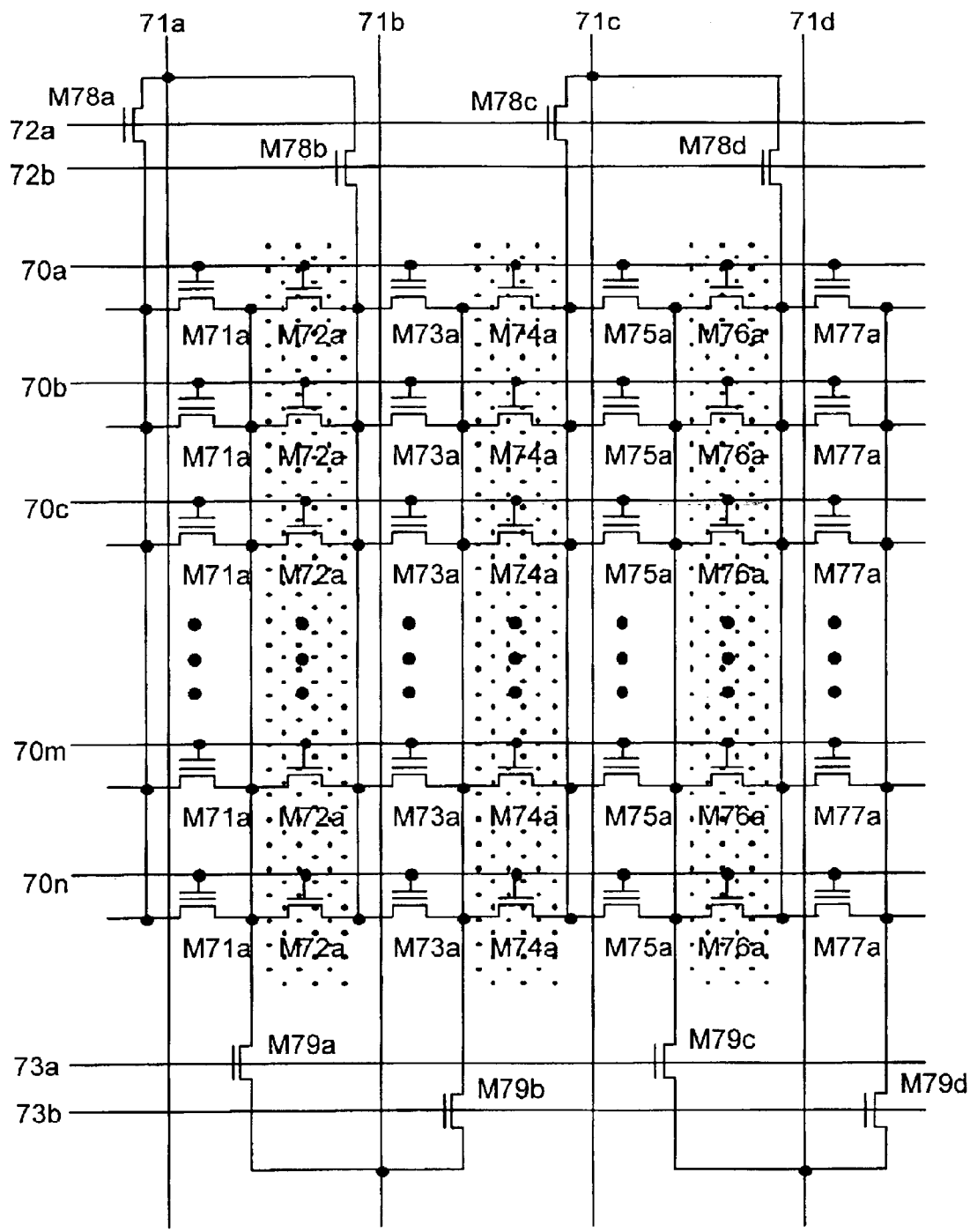

Referring now to FIGS. 10 and 11, the first preferred embodiment is shown in greater detail in two further embodiments. The AND-type array of FIG. 10 comprises a plurality of main bit lines 61A, 61B, 61C, and 61D, a horizontal main source line 64, bit line select transistors M68A to M68D, and source line select transistors M69A to M69D. FIG. 11 shows a different embodiment of the same AND-type array where the array comprises a plurality of main bit line 71A and 71C, a plurality of main source lines 71B and 71D (that run in the vertical direction like main bit lines), bit line select transistors M78A to M78D, and source line select transistors M79A to M79D.

Figure 12:
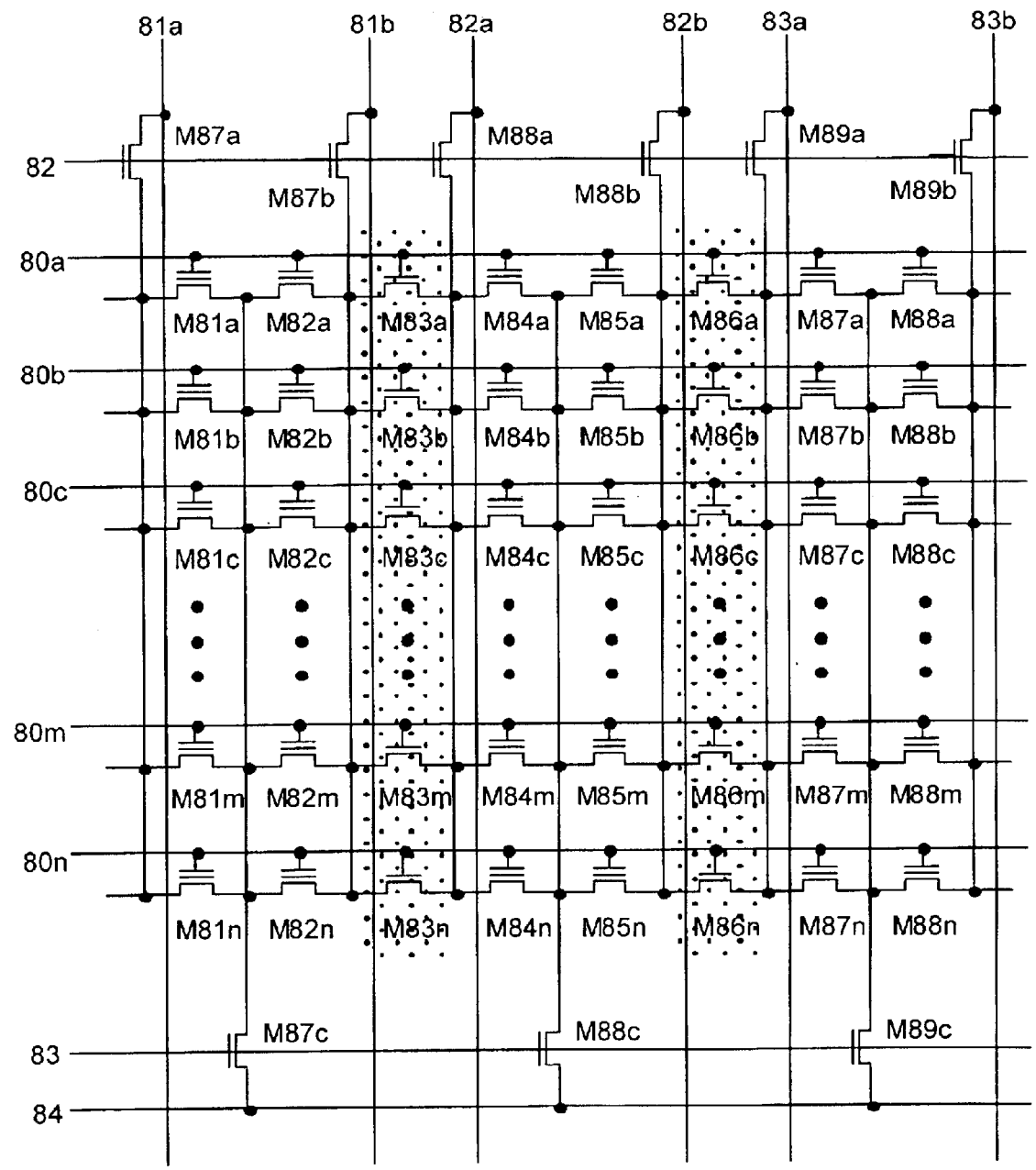
FIG. 12 illustrates the second embodiment further by showing a more detailed array structure.

Referring now to FIG. 12, a further embodiment of the second preferred embodiment of the present invention is shown. This embodiment of the dual string, NOR-type array comprises a plurality of main bit line pairs 81A and 81B, 82A and 82B, 83A and 83B, a horizontal main source line 84, bit line select transistors M78A to M89B, and source line select transistors M87C, M88C, and M89C.

Another important feature of the present invention is its effectiveness in the area of embedded memory development. In industrial applications, it is highly desirable to be able to quickly convert Flash memory array memory into mask ROM array memory to save money and to reduce turn-around cycle time. Due to the re-programmability of Flash memory, it is widely used for embedded memory applications for the storage of drivers, program code, or data code during new product development. In this way, the driver, program code, or data code of the new product can be easily updated to meet the market demands.

When the product development is nearing maturity, and the product code or data code no longer needs to change, it is highly desirable to convert the Flash memory function into a permanent, mask ROM memory function to reduce manufacturing cost. However, typical Flash memory and mask ROM memory cells have different cell sizes. Therefore, changing the memory from Flash to ROM requires a re-layout of the entire memory and the creation of a new floor plan to fit the mask ROM array size into the Flash memory area. Due to the inconvenience and cost of this process, new product development and maturity is slowed down. For the disclosed Flash cell and mask ROM cell architecture, the Flash memory array can easily be converted to a mask ROM array by simply eliminating a few process steps such as tunnel oxide deposition, floating gate polysilicon deposition and patterning, and ONO deposition and patterning. In addition, since the array size remains the same before and after conversion of the Flash and ROM array into a ROM-only array, the memory device can easily be converted without any re-layout or floor plan change.

The advantages of the present invention may now be summarized. An effective and manufacturable memory device is achieved. The memory device has a highly integrated array of Flash cells and mask ROM cells. The mask ROM cells are placed in the Flash cell array by replacing STI regions between Flash cells with mask ROM cells. The memory density of a Flash-based memory cell array is doubled by replacing the STI regions with mask ROM cells. The highly integrated Flash cell and mask ROM cell array is achieved using a range of Flash cell technologies and array architectures. A method to form an integrated Flash cell and mask ROM cell array with minimal change to the Flash cell process is achieved. The method to form an integrated Flash cell and mask ROM cell array is ideally suited for developing embedded memory applications.

As shown in the preferred embodiments, the novel method and circuit of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A memory device comprising an array of Flash cells and mask ROM cells in a common substrate wherein each said Flash cell comprises a floating gate, a control gate, a source, a drain, and a channel, wherein each said mask ROM cell comprises a gate, a source, a drain, and a channel, wherein each said source of said mask ROM cells is shared with one said Flash cell source, wherein each electrode of each said mask ROM cell gate is coupled to at least one said Flash cell control gate, wherein said mask ROM cell gate electrodes comprise a common layer with electrodes of said Flash cell control gates, and wherein said mask ROM cells lie in spaces between said Flash cells in said array.

2. The device according to claim 1 wherein said mask ROM cell gates comprise a dielectric layer between an electrode layer and said substrate, wherein said Flash cell control gates comprise a dielectric layer between an electrode layer and said floating gates, and wherein said mask ROM cell gate dielectric layer and said Flash cell control gate dielectric layer are not the same layer.

3. The device according to claim 1 wherein said mask ROM cells comprise one of at least two possible threshold voltage levels and wherein said threshold voltage levels are programmed using selective ion implantation.

4. The device according to claim 1 wherein said Flash cells comprise a stacked-gate arrangement where said floating gates comprise a conductive electrode layer.

5. The device according to claim 1 wherein said Flash cells comprise a MONOS arrangement where said floating gates comprise a non-conductive electrode layer.

6. The device according to claim 1 wherein said Flash cells comprise a split-gate arrangement where said Flash cell floating gates only overlie a part of each said Flash cell channel.

7. The device according to claim 1 wherein each of said mask ROM cell drains is shared with one of said Flash cell drains.

8. The device according to claim 1 wherein said array comprises columns of said Flash cells and columns of said mask ROM cells and wherein each said mask ROM cell column is adjacent to at least one said Flash cell column.

9. The device according to claim 8 wherein a plurality of said Flash cell control gates and said mask ROM cell gates are coupled together by a common wordline such that said Flash cells and said mask ROM cells in said plurality are commonly addressed for data access.

10. The device according to claim 8 wherein said array comprises equal numbers of said Flash cells and said mask ROM cells.

11. The device according to claim 8 a wherein each said Flash cell column is between two said mask ROM cell columns to thereby form an AND-type said array.

12. The device according to claim 8 wherein each said Flash cell column is between one said mask ROM cell column and one said Flash cell column to thereby form a dual string, NOR-type said array.

13. A memory device comprising an array of Flash cells and mask ROM cells in a common substrate wherein each said Flash cell comprises a floating gate, a control gate, a source, a drain, and a channel, wherein each said mask ROM cell comprises a gate, a source, a drain, and a channel, wherein each said source of said mask ROM cells is shared with one said Flash cell source, wherein each electrode of each said mask ROM cell gate is coupled to at least one said Flash cell control gate, wherein said mask ROM cell gate electrodes comprise a common layer with electrodes of said Flash cell control gates, wherein said array comprises columns of said Flash cells and columns of said mask ROM cells, wherein each said mask ROM cell column is adjacent to at least one said Flash cell column, and wherein said mask ROM cells lie in spaces between said Flash cells in said array.

14. The device according to claim 13 wherein said mask ROM cell gates comprise a dielectric layer between an electrode layer and said substrate, wherein said Flash cell control gates comprise a dielectric layer between an electrode layer and said floating gates, and wherein said mask ROM cell gate dielectric layer and said Flash cell control gate dielectric layer are not the same layer.

15. The device according to claim 13 wherein said mask ROM cells comprise one of at least two possible threshold voltage levels and wherein said threshold voltage levels are programmed using selective ion implantation.

16. The device according to claim 13 wherein said Flash cells comprise a stacked-gate arrangement where said floating gates comprise a conductive electrode layer.

17. The device according to claim 13 wherein said Flash cells comprise a MONOS arrangement where said floating gates comprise a non-conductive electrode layer.

18. The device according to claim 13 wherein said Flash cell comprise a split-gate arrangement where said Flash cell floating gates only overlie a part of each said Flash cell channel.

19. The device according to claim 13 wherein each of said mask ROM cell drains is shared with one of said Flash cell drains.

20. The device according to claim 13 wherein a plurality of said Flash cell control gates and said mask ROM cell gates are coupled together by a common wordline such that said Flash cells and said mask ROM cells in said plurality are commonly addressed for data access.

21. The device according to claim 13 wherein said array comprises equal numbers of said Flash cells and said mask ROM cells.

22. The device according to claim 13 wherein each said Flash cell column is between two said mask ROM cell columns to thereby form an AND-type said array.

23. The device according to claim 13 wherein each said Flash cell column is between one said mask ROM cell column and one said Flash cell column to thereby form a dual string, NOR-type said array.

24. A method to form an integrated circuit memory device comprising an array of Flash cells and mask ROM cells in a common substrate wherein each said Flash cell comprises a floating gate, a control gate, a source, a drain, and a channel, and wherein each said mask ROM cell comprises a gate, a source, a drain, and a channel, said method comprising:

forming sources and drains in a substrate for Flash cells and for mask ROM cells wherein each of said mask ROM cell sources is shared with one of said Flash cell sources;

forming floating gates for said Flash cells;

implanting ions into said substrate in channels of selected said mask ROM cells to alter a threshold voltage of said selected mask ROM cells;

forming control gates for said Flash cells and gates for said mask ROM cells to complete said integrated circuit memory device, wherein said Flash cell control gates comprise an electrode layer overlying said Flash cell floating gates with a dielectric layer therebetween, wherein electrodes of each said mask ROM cell gate is coupled to at least one of said Flash cell control gates, wherein said mask ROM cell electrodes comprise said Flash cell control gate electrode layer, and wherein said mask ROM cells lie in spaces between said Flash cells in said array.

25. The method according to claim 24 further comprising:

removing said Flash cell control gate dielectric layer in said mask ROM cell channels after depositing said Flash cell control gate dielectric layer;

thereafter forming a mask ROM cell gate dielectric layer overlying said substrate; and thereafter depositing said Flash cell control gate electrode layer overlying said Flash cell control gate dielectric layer and said mask ROM cell gate dielectric layer.

26. The method according to claim 24 wherein said Flash cells comprise a stacked-gate arrangement where said floating gates comprise a conductive electrode layer.

27. The method according to claim 24 wherein said Flash cells comprise a MONOS arrangement where said floating gates comprise a non-conductive electrode layer.

28. The method according to claim 24 wherein said Flash cell comprise a split-gate arrangement where said Flash cell floating gates only overlie a part of each said Flash cell channel.

29. The method according to claim 24 wherein each of said mask ROM cell drains is shared with one of said Flash cell drains.

30. The method according to claim 24 wherein said array comprises columns of said Flash cells and columns of said mask ROM cells and wherein each said mask ROM cell column is adjacent to at least one said Flash cell column.

31. The method according to claim 24 wherein a plurality of said Flash cell control gates and said mask ROM cell gates are coupled together by a common wordline such that said Flash cells and said mask ROM cells in said plurality are commonly addressed for data access.

32. The method according to claim 24 wherein said array comprises equal numbers of said Flash cells and said mask ROM cells.

33. The method according to claim 24 wherein each said Flash cell column is between two said mask ROM cell columns to thereby form an AND-type said array.

34. The method according to claim 24 wherein each said Flash cell column is between one said mask ROM cell column and one said Flash cell column to thereby form a dual string, NOR-type said array.

35. The method according to claim 24 wherein said array comprises only said mask ROM cells if said step of forming floating gates for said Flash cells is omitted.

* * * * *